(12) United States Patent
Lee et al.

(10) Patent No.: US 9,812,543 B2
(45) Date of Patent: Nov. 7, 2017

(54) COMMON METAL CONTACT REGIONS HAVING DIFFERENT SCHOTTKY BARRIER HEIGHTS AND METHODS OF MANUFACTURING SAME

(71) Applicant: GLOBALFOUNDRIES Inc., Grand Cayman (KY)

(72) Inventors: Tek Po Rinus Lee, Malta, NY (US); Jinping Liu, Ballston lake, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/060,761

(22) Filed: Mar. 4, 2016

(65) Prior Publication Data

US 2017/0256624 A1 Sep. 7, 2017

(51) Int. Cl.
| H01L 21/266 | (2006.01) |
| H01L 29/47 | (2006.01) |
| H01L 29/40 | (2006.01) |
| H01L 27/092 | (2006.01) |
| H01L 21/8238 | (2006.01) |
| H01L 21/285 | (2006.01) |

(52) U.S. Cl.
CPC .......... *H01L 29/47* (2013.01); *H01L 21/266* (2013.01); *H01L 21/28518* (2013.01); *H01L 21/823814* (2013.01); *H01L 21/823871* (2013.01); *H01L 21/823878* (2013.01); *H01L 27/092* (2013.01); *H01L 29/401* (2013.01)

(58) Field of Classification Search
CPC .................. H01L 29/47; H01L 21/266; H01L 21/823878; H01L 21/28518; H01L 21/823871; H01L 27/092; H01L 29/401; H01L 21/823814
USPC ......... 257/369, 401, 192, 586, 328; 438/275
See application file for complete search history.

(56) References Cited

U.S. PATENT DOCUMENTS

| 7,861,406 B2 | 1/2011 | Lodha et al. | |
| 2005/0214965 A1* | 9/2005 | Park | H01L 33/0079 438/33 |
| 2009/0026552 A1* | 1/2009 | Zhang | H01L 21/26506 257/401 |
| 2009/0068810 A1* | 3/2009 | Tsai | H01L 29/6656 438/300 |
| 2014/0210011 A1 | 7/2014 | Baraskar et al. | |
| 2014/0248761 A1* | 9/2014 | Park | H01L 21/823871 438/586 |
| 2016/0020325 A1* | 1/2016 | Xie | H01L 27/092 257/192 |

* cited by examiner

*Primary Examiner* — Bo Fan
(74) *Attorney, Agent, or Firm* — Ditthavong & Steiner, P.C.

(57) ABSTRACT

Methods for forming a semiconductor device having dual Schottky barrier heights using a single metal and the resulting device are provided. Embodiments include providing a substrate having an n-FET region and a p-FET region, each region including a gate between source/drain regions; applying a mask over the n-FET region; selectively amorphizing a surface of the p-FET region source/drain regions while the n-FET region is masked; removing the mask; depositing a titanium-based metal over the n-FET and p-FET region source/drain regions; and microwave annealing.

6 Claims, 5 Drawing Sheets

US 9,812,543 B2

COMMON METAL CONTACT REGIONS HAVING DIFFERENT SCHOTTKY BARRIER HEIGHTS AND METHODS OF MANUFACTURING SAME

TECHNICAL FIELD

This disclosure relates to metal on oxide field effect transistor (MOSFET) manufacture. In particular, this disclosure relates to MOSFET silicide formation.

BACKGROUND

Earlier methods for forming MOSFETs include amorphizing a contact area of a source/drain region of a transistor device, implanting, and forming a first layer of metal on the contact area.

Other earlier methods include using two different metals for two different contact area types such as p-FET and n-FET. This enables selective tuning of a silicide workfunction for p-FET and n-FET contact areas. Such dual metal, dual silicide formation techniques provide selective Schottky barrier heights depending on a type of metal used to process each layered contact area. Other methods include using both multiple masks and different metals during the formation of a MOSFET to enable selective tuning of a first contact area and a second contact area.

Conventionally, nickel silicide (NiSi) has been employed for MOSFET contact areas. Titanium silicide (TiSi) improves manufacturing yields by eliminating or obviating nickel silicide (NiSi) pipes that, for example, lead to shorting and other performance issues. As such, TiSi has more recently been preferred for MOSFET manufacturing processes to account for smaller device scales. TiSi lags behind other materials, specifically, for p-FET performance, having a higher On-resistance (Ron) and a higher Schottky barrier height (SBH) to EV at the silicon or silicon germanium interface.

A need therefore exists for MOSFET manufacturing methods enabling the use of TiSi while minimizing manufacturing steps and materials and enhancing p-FET performance capability.

SUMMARY

An aspect of the present disclosure is a method of forming a MOSFET device by selectively amorphizing p-FET region source/drain regions and microwave annealing.

Another aspect of the present disclosure is a MOSFET device with an n-FET region exhibiting a lower p-FET SBH and minimal n-FET SBH degradation.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method for forming a device by providing a substrate having an n-FET region and a p-FET region, each region including a gate between source/drain regions; applying a mask over the n-FET region; selectively amorphizing a surface of the p-FET region source/drain regions while the n-FET region is masked; removing the mask; depositing a titanium-based metal over the n-FET and p-FET region source/drain regions; and microwave annealing.

Aspects include implanting a dopant into the p-FET region source/drain regions prior to amorphization. A further aspect includes implanting germanium into the p-FET region source/drain regions. Another aspect includes the titanium-based metal including Ti or TiN, or a combination thereof. Other aspects include heating to form a Ti—Si intermix phase liner at the n-FET source/drain regions. An additional aspect includes heating at a temperature between 300° C. and 700° C. A further aspect includes intentionally damaging the surface of only the p-FET region by implantation at the p-FET region only prior to microwave annealing.

Another aspect of the present disclosure is a device having a semiconductor substrate having an n-FET region and a p-FET region each having source/drain regions; a titanium silicon (Ti—Si) intermix phase Ti liner on an upper surface of the n-FET region source/drain regions; and titanium silicide (TiSi) forming an upper surface of the p-FET region source/drain regions. The p-FET region source/drain region further includes germanium in some aspects of the present disclosure. An aspect of the present disclosure is the p-FET region source/drain region including surface defects or dopants. Another aspect is a contact surface of the p-FET region source/drain regions being amorphized. A further aspect of the disclosure is the n-FET region exhibiting a first SBH and the p-FET region exhibiting a second SBH that is different from the first SBH. The first SBH is a lower value than the second SBH in some aspects. In another aspect, an interlayer dielectric (ILD) may be disposed over the n-FET and p-FET regions, with trenches formed in the ILD down to the source/drain regions and a contact metal filling the trenches.

Another aspect of the present disclosure includes a method including providing a substrate having an n-FET region and a p-FET region separated by a shallow trench isolation (STI) region, each of the n-FET and p-FET regions including a gate between source/drain regions; forming an ILD over the substrate, with trenches formed through the ILD down to the source/drain regions; applying a mask over the n-FET region; implanting a dopant into the p-FET region source/drain regions through the trenches in the ILD; selectively amorphizing a surface of the p-FET region source/drain regions while the n-FET region is masked; removing the mask; depositing a titanium-based metal in the trenches over the n-FET and p-FET region source/drain regions; and microwave annealing.

Additional aspects include heating to form a Ti—Si intermix phase liner at the n-FET source/drain regions. Another aspect includes heating at a temperature between 500° C. and 600° C.

An additional aspect includes intentionally damaging the surface of only the p-FET region by implantation at the p-FET region only prior to microwave annealing.

A further aspect includes the n-FET region exhibiting a first SBH and the p-FET region exhibiting a second SBH that is different from the first SBH. An additional aspect includes the titanium-based metal including Ti or TiN, or a combination thereof.

Additional features and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
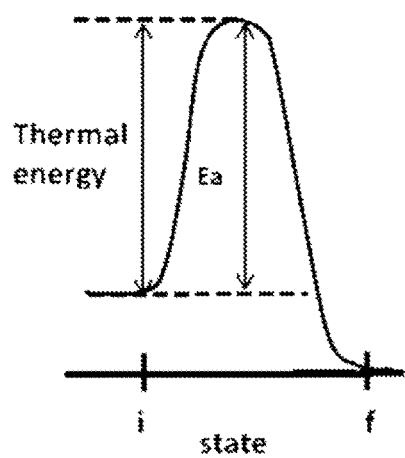
FIG. 1A shows a reaction diagram using a conventional rapid thermal anneal (RTA)

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about".

The present disclosure addresses and solves the current problems of high Ron and higher SBH to EV at the p-FET silicide to silicon interface, and therefore, reduced device performance. By using Ti to form contact areas of both p-FET and n-FET of a transistor device, and using selective amorphizing and microwave annealing processes, the contact area of the p-FET may include a Ti silicide phase layer, while the contact area of the n-FET may include a Ti—Si intermixlayer. Accordingly, although the SBH for the n-FET and p-FET may be different, they may be selectively tuned to benefit both the n-FET and the p-FET.

According to current processes at the 14 nanometer (nm) node, after a Ti layer is applied to a contact area and annealed the Ti remains as a liner in an intermix phase depending on an annealing temperature. Annealing at 500 degrees Celsius (° C.) to about 600° C. achieves a 20 millivolt (mV) to 30 mV reduction in SBH due to intermixing. This indicates that Ti—Si may have a SBH of 0.42 eV to EC, which is beneficial for n-FET performance, but which results in a SBH of about 0.7 eV to EV for p-FETS. Nickel silicide (NiSi), on the other hand, has a SBH of about 0.47 eV to EV. Accordingly, NiSi is superior to TiSi for p-FET performance.

When Ti—Si is annealed at a temperature of greater than or equal to 700° Ca silicide is formed having a SBH of greater than 0.5 eV to EC. The annealing temperature may be selected to achieve a desired SBH.

A higher SBH of greater than 0.5 eV to EC is preferred for a p-FET region. A lower SBH to EC, for example 0.42 eV, enabled by a Ti—Si intermix phase layer or Ti liner, is preferred for an n-FET region. Regions of a semiconductor structure may be selectively heated with microwave annealing based on amorphization/defect/dopant of the specific region. Source/drain regions of the p-FET may be selectively heated, for example, by intentionally damaging a surface at the source/drain regions for the p-FET, or by implanting at the source/drain regions of the p-FET. Microwave annealing selectively heats ionized regions in a lattice at the p-FET semiconductor-metal interface and maintains a relatively low wafer temperature, allowing for lower temperature annealing at an n-FET region. Accordingly, TiSi forms at the p-FET region by way of selective heating during microwave annealing following amorphizing the p-FET region, while an intermix phase of Ti—Si remains at the n-FET region.

Figure 1B:
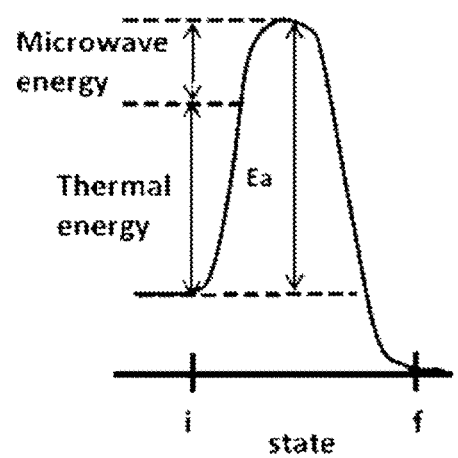
FIG. 1B shows a reaction diagram using RTA and microwave heating, in accordance with an exemplary embodiment.

Adverting to FIG. 1A, when RTA alone is employed for annealing during contact formation, thermal energy is used to overcome the activation energy Ea for achieving a transition state. This can cause heating of substantially the entire wafer. In contrast, FIG. 1B shows a combination of thermal energy and microwave energy being used to overcome the Ea to achieve a transition state, in accordance with an exemplary embodiment. Using microwave annealing, the Ea may be overcome by a combination of substrate temperature and direct coupling of microwave energy into the lattice using dopants, dopant clusters, and defects in the wafer. This leads to lower wafer temperature. Thus, microwave annealing enables controlled and limited reliance on thermal energy during processing on substrate or wafer to form a metal layer on a contact area or regions of a transistor device. By intentionally damaging or doping only the p-FET side source/drain regions, the p-FET portion of the substrate may be selectively heated, leading to TiSi formation of the p-FET side while leaving an intermix phase of Ti—Si on the n-FET side.

Figure 2:
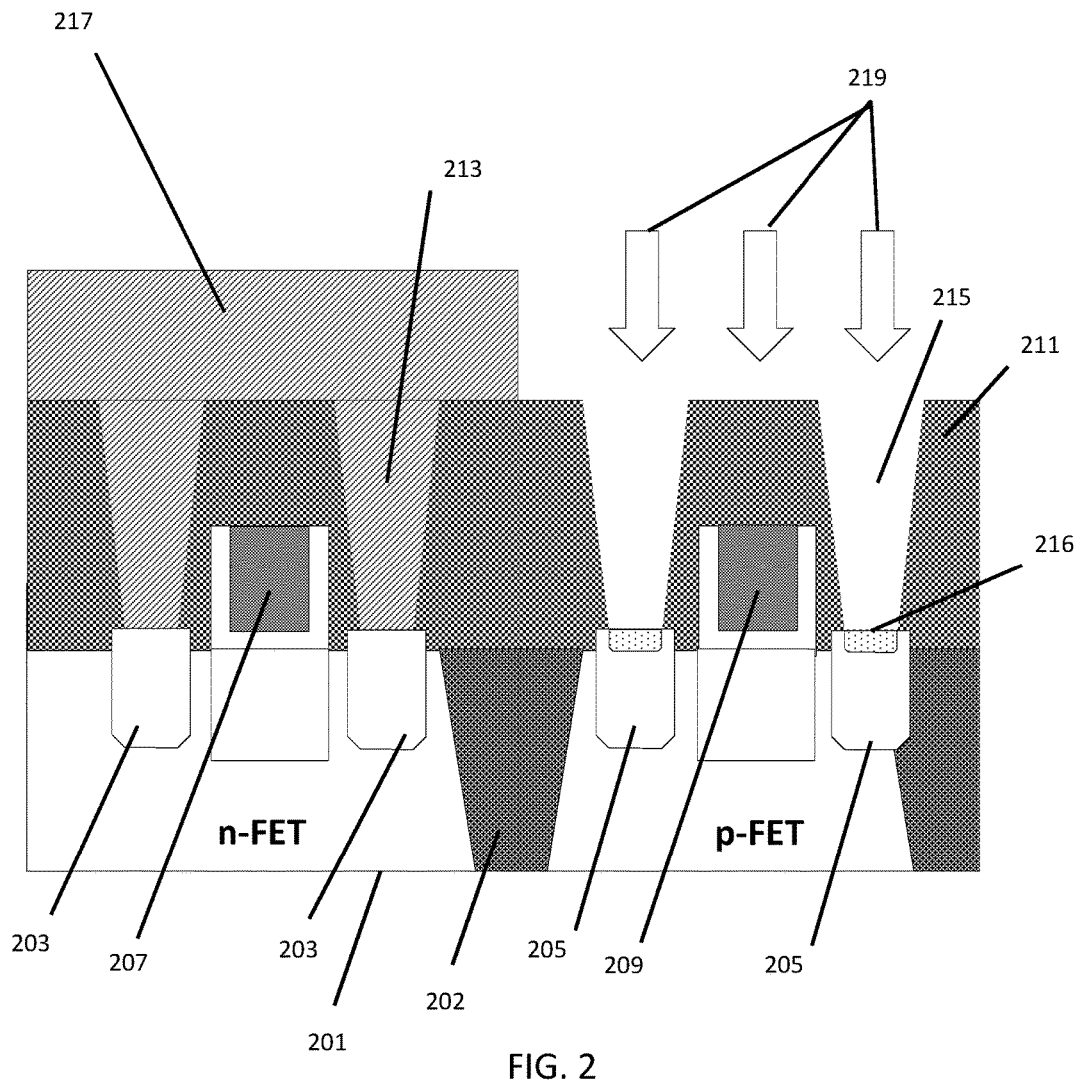
FIGS. 2 through 4 schematically illustrate a process for manufacturing a MOSFET with dual SBH, in accordance with an exemplary embodiment.
Figure 3:
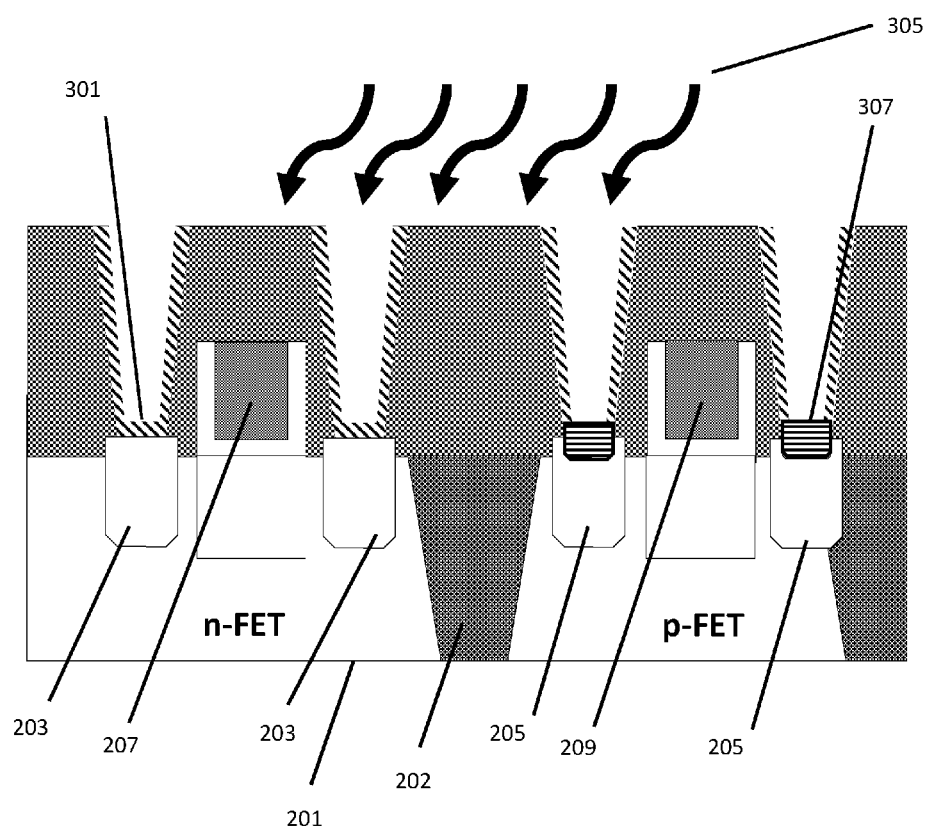
Figure 4:
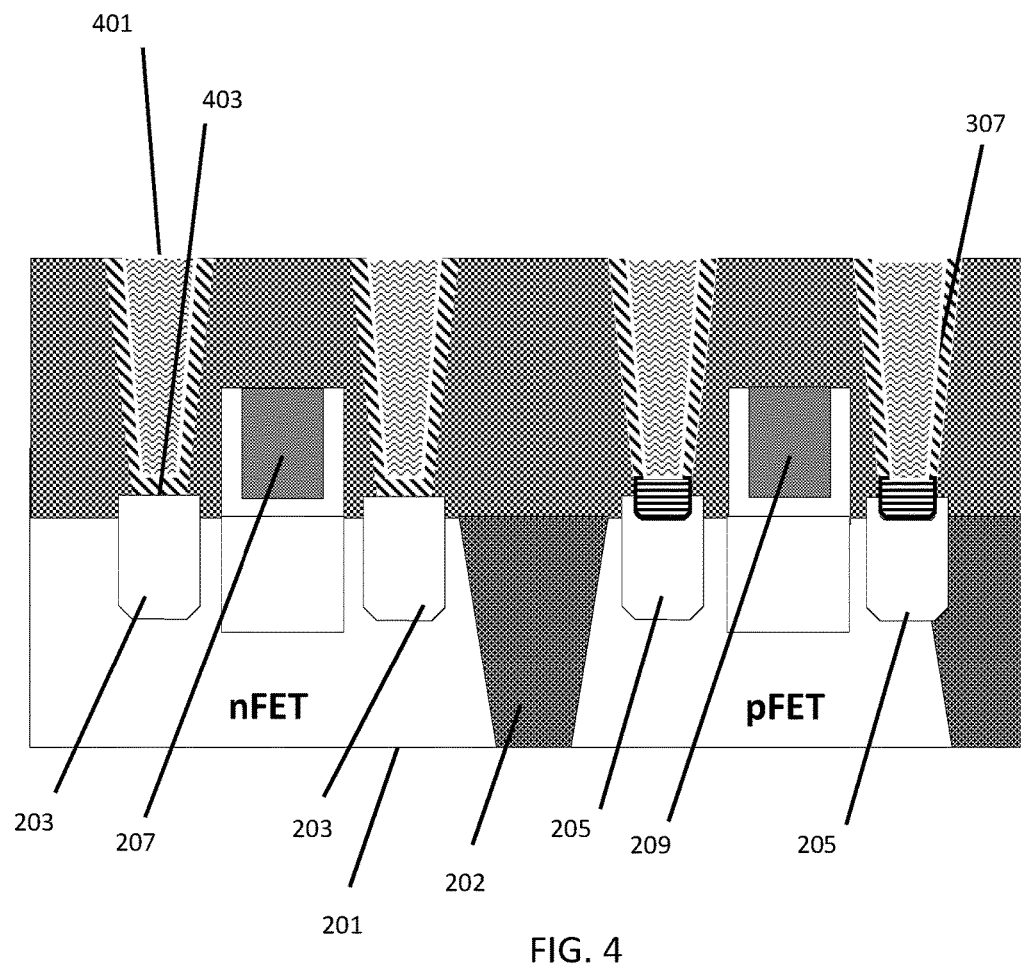

FIGS. 2 through 4 show a manufacturing method in accordance with an exemplary embodiment. FIG. 2 shows a substrate 201, which may be a semiconductor wafer such as a silicon or silicon germanium wafer having n-FET and a p-FET regions separated by shallow trench isolation (STI) regions 202. Source/drain regions 203 for the n-FET and source/drain regions 205 for the p-FET are formed on opposite sides, respectively, of n-FET gate 207 and p-FET gate 209. The source/drain regions may include silicon or silicon containing materials, for example silicon germanium, silicon carbon, silicon phosphorus, silicon carbon phosphorus. An interlayer dielectric 211 is formed over the entire wafer, with trenches 213 and 215 formed over source/drain regions 203 and 205, respectively. A blocking material or mask 217 is applied over the n-FET region, filling the trenches 213. Then, a surface 216 of the source/drain regions 205 may be intentionally damaged or implanted by pre-amorphization ion implant (PAI) process 219 applied to exposed areas of the p-FET source/drain regions 205. For example, ion species useful for implantation 219 may include germanium, nitrogen, silicon, argon, or similarly suitable materials. The blocking material or mask 217 prevents the n-FET region from receiving the implants and/or additional dopants that amorphize the p-FET source/drain region.

Following the PAI 219 and amorphization, the blocking material or mask 217 is removed, and Ti or titanium nitride (TiN) may be applied in trenches 213 and 215, including surfaces of both n-FET source/drain region 203 and p-FET source/drain region 205 to form a Ti layer 301, as illustrated in FIG. 3. FIG. 3 shows microwave exposure 305 applied to the Ti layer 315. The amorphized surfaces 216 of the source/drain regions 205 of the p-FET are selectively annealed/heated by microwave annealing to form a TiSi layer 307 having a high SBH to EC. The n-FET regions will remain unaffected by the selective anneal process, and wafer temperatures may remain below 600° C. to preserve an intermix phase Ti—Si layer at the n-FET source/drain regions 203, exhibiting a low SBH to EC.

Following microwave annealing, a process flow may continue with conventional processing, such as tungsten deposition to fill the remaining trenches of the MOSFET structure and chemical mechanical planarization or polishing. FIG. 4 shows the tungsten fill 401 in the trenches 213 and 215. FIG. 4 shows the TiSi phase layer 307 forming contacts for the p-FET and the intermix Ti—Si layer 403 forming contacts for the n-FET. The Ti—Si intermix phase disposed on the n-FET and the TiSi phase disposed on the p-FET can thus be selectively tuned for optimal performance.

Figure 5:
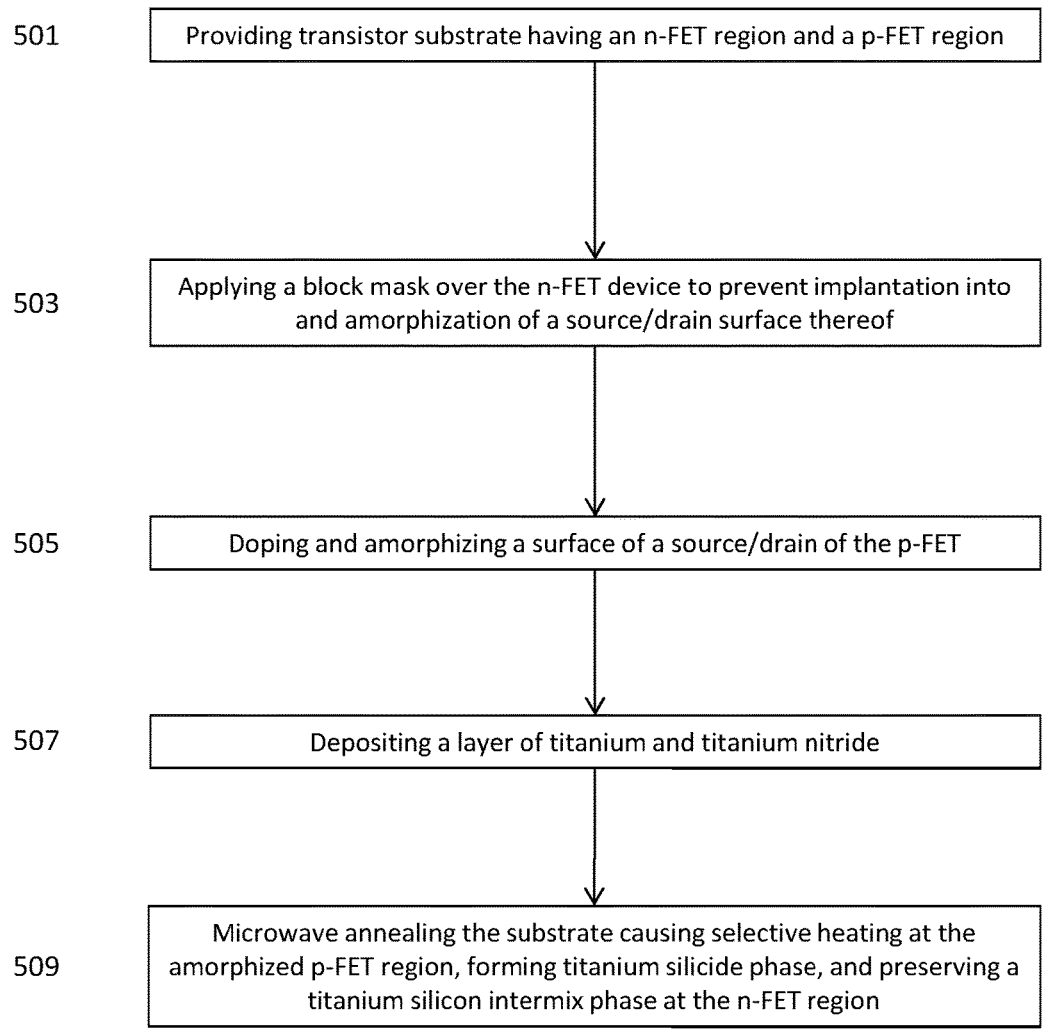
FIG. 5 shows a process flow for forming a MOSFET device having a single metal active layer exhibiting different SBH for p-FET and n-FET regions of the device, in accordance with an exemplary embodiment.

FIG. 5 shows an exemplary process flow, in accordance with an exemplary embodiment, for forming a MOSFET device having an n-FET region and a p-FET region wherein the p-FET region exhibits a different SBH than the n-FET region. The process flow may be preceded and followed by conventional processes for transistor device fabrication. FIG. 5 shows a process in accordance with an exemplary embodiment including providing, at step 501, a transistor substrate having an n-FET region and a p-FET region, each with a pair of active regions on the substrate for source/drain regions, and a gate formed on the substrate between the source/drain regions. The entire substrate is covered with an ILD, with trenches formed through the ILD down to the source/drain regions.

The process in FIG. 5 includes applying a blocking material or mask to the n-FET region of the device, covering an exposed contact region over the source/drain regions and filling the trenches over the n-FET source/drain regions at step 503. The blocking material or mask is configured to prevent implantation into and amorphization of a surface of the contact region during implantation and amorphization at the p-FET contact region. In particular, an exposed contact region of the p-FET region may be implanted with dopants and amorphized at step 505.

Next, the blocking material or mask may be removed from the n-FET region (step not shown for illustrative convenience). Then, a layer of Ti or TiN, or a combination thereof, may be deposited over substrate and in the trenches at step 507. In particular, the Ti or TiN layer may be deposited over both the n-FET and p-FET contact regions, covering source/drain region surfaces thereof. The Ti or TiN layer covers both the non-amorphized surface of the contact-FET region, and the surface of the p-FET contact region amorphized at step 505.

At step 509, the device may be exposed to microwave radiation for microwave annealing. The microwave annealing process selectively heats the amorphized p-FET region to form TiSi. The n-FET, non-amorphized region is annealed at a lower temperature than the p-FET region at step 509. Accordingly, a Ti—Si intermix phase is preserved at the n-FET contact region.

The embodiments of the present disclosure can achieve several technical effects. By using TiSi for transistor devices of a microelectronic device, NiSi pipes may be eliminated, device performance may be enhanced, and higher manufacturing yields maybe obtained. During processing, a single metal layer may be applied, enhancing process efficiency and minimizing material costs. Selective heating of the p-FET source/drain regions accomplished by amorphizing the p-FET region while leaving the n-FET region non-amoprhized, and subsequent microwave annealing of a Ti and TiN layer deposited over both regions enables a reduced wafer temperature at the n-FET region. Thus, a resulting Ti—Si intermix phase is preserved at the n-FET region providing low SBH to EC, while a resulting TiSi phase is formed at the p-FET region providing a different, for example, higher SBH to EC. Embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    providing a substrate having an n-FET region and a p-FET region separated by a shallow trench isolation (STI) region, each of the n-FET and p-FET regions including a gate between source/drain regions;
    forming an interlayer dielectric (ILD) over the substrate, with trenches formed through the ILD down to the source/drain regions;
    applying a mask over the n-FET region;
    implanting a dopant into the p-FET region source/drain regions through the trenches in the ILD;
    selectively amorphizing a surface of the p-FET region source/drain regions while the n-FET region is masked;
    removing the mask;
    depositing a titanium-based metal in the trenches over the n-FET and p-FET region source/drain regions; and
    microwave annealing.

2. The method according to claim 1, wherein the titanium-based metal comprises Ti or TiN, or a combination thereof.

3. The method according to claim 1, further comprising:
    heating to form a Ti—Si intermix phase liner at the n-FET source/drain regions.

4. The method according to claim 3, comprising heating at a temperature between 500° C. and 600° C.

5. The method according to claim 1, further comprising:
    intentionally damaging the surface of only the p-FET region by implantation at the p-FET region only prior to microwave annealing.

6. The method according to claim 1, wherein the n-FET region exhibits a first Schottky barrier height (SBH) and the p-FET region exhibits a second SBH that is different from the first SBH.

* * * * *